US011096297B2

(12) United States Patent
Karszt et al.

(10) Patent No.: US 11,096,297 B2
(45) Date of Patent: Aug. 17, 2021

(54) HOUSING FOR ELECTRONIC COMPONENTS

(71) Applicants: Norbert Karszt, Unterschleissheim (DE); Sebastian Hetzel, Dachau (DE)

(72) Inventors: Norbert Karszt, Unterschleissheim (DE); Sebastian Hetzel, Dachau (DE)

(73) Assignee: VEONEER SWEDEN AB, Vargarda (SE)

( * ) Notice: Subject to any disclaimer, the term of this patent is extended or adjusted under 35 U.S.C. 154(b) by 0 days.

(21) Appl. No.: 16/302,863

(22) PCT Filed: May 23, 2017

(86) PCT No.: PCT/EP2017/062476
§ 371 (c)(1),
(2) Date: Nov. 19, 2018

(87) PCT Pub. No.: WO2017/202876
PCT Pub. Date: Nov. 30, 2017

(65) Prior Publication Data
US 2019/0307001 A1    Oct. 3, 2019

(30) Foreign Application Priority Data

May 24, 2016 (EP) .................................. 16171048

(51) Int. Cl.
*H05K 5/02*    (2006.01)
*B60R 16/023*  (2006.01)
(Continued)

(52) U.S. Cl.
CPC ....... *H05K 5/0213* (2013.01); *B60R 16/0239* (2013.01); *H05K 5/0008* (2013.01);
(Continued)

(58) Field of Classification Search
CPC .. H05K 5/0213; H05K 5/0008; H05K 5/0017; H05K 5/0056; H05K 5/0247; H05K 5/069
See application file for complete search history.

(56) References Cited

U.S. PATENT DOCUMENTS 3,969,630 A    7/1976  Langford et al.
9,209,554 B2  12/2015  Wiessneth
(Continued)

FOREIGN PATENT DOCUMENTS

CN    200986465 Y    12/2007
CN    102404978 A     4/2012
(Continued)

OTHER PUBLICATIONS

International Search Report and Written Opinion of PCT/EP2017/062476 dated Aug. 23, 2017.

*Primary Examiner* — James Wu
*Assistant Examiner* — Christopher L Augustin
(74) *Attorney, Agent, or Firm* — Dickinson Wright PLLC

(57) ABSTRACT

A housing for electronic components within a vehicle, the housing comprising: a main compartment adapted to house one or more electronic components; and a venting arrangement to allow a gas flow path between an interior of the main compartment and the exterior of the main compartment, wherein the venting arrangement comprises: a shield portion positioned on the exterior of the main compartment and defining a flow pathway having first and second apertures at respective first and second ends thereof, at which the flow pathway is in communication with the atmosphere; and a communication passage extending between the interior of the main compartment and the flow pathway, and joining the flow pathway at a position between the first and second ends thereof, wherein the communication passage meets the flow (Continued)

pathway at a point which is nearer to the first end than the second end.

16 Claims, 3 Drawing Sheets

(51) Int. Cl.
  *H05K 5/00* (2006.01)
  *H05K 5/06* (2006.01)
(52) U.S. Cl.
  CPC ......... *H05K 5/0017* (2013.01); *H05K 5/0056* (2013.01); *H05K 5/0247* (2013.01); *H05K 5/069* (2013.01)

(56) References Cited

U.S. PATENT DOCUMENTS

| | | | | |
|---|---|---|---|---|
| 9,516,769 | B2* | 12/2016 | Kaneko | H05K 1/0203 |
| 9,667,297 | B1* | 5/2017 | Miehl | A45C 11/00 |
| 2002/0190485 | A1* | 12/2002 | Ohyama | H05K 5/0213 |
| | | | | 277/628 |
| 2003/0184973 | A1* | 10/2003 | Nagata | B60R 16/0239 |
| | | | | 361/704 |
| 2005/0115727 | A1* | 6/2005 | Sakata | B60R 16/0239 |
| | | | | 174/17 VA |
| 2008/0041624 | A1* | 2/2008 | Sasaki | H05K 5/068 |
| | | | | 174/520 |
| 2013/0109209 | A1* | 5/2013 | Wiessneth | H05K 5/0026 |
| | | | | 439/206 |
| 2015/0021066 | A1 | 1/2015 | Hillstrom et al. | |
| 2015/0208525 | A1* | 7/2015 | Negishi | H05K 5/0056 |
| | | | | 361/752 |
| 2015/0306529 | A1* | 10/2015 | Yano | B01D 46/0002 |
| | | | | 96/7 |
| 2015/0313034 | A1* | 10/2015 | Yano | H05K 5/0213 |
| | | | | 428/68 |
| 2015/0359112 | A1* | 12/2015 | Nakashima | H05K 7/026 |
| | | | | 174/560 |

FOREIGN PATENT DOCUMENTS

| | | |
|---|---|---|
| DE | 10 2010 042 254 A1 | 1/2012 |
| DE | 10 2013 100257 A1 | 7/2014 |
| EP | 2 416 638 A2 | 2/2012 |

* cited by examiner

HOUSING FOR ELECTRONIC COMPONENTS

CROSS-REFERENCE TO RELATED APPLICATIONS

This application is a 35 U.S.C. § 371 national phase of PCT International Application No. PCT/EP2017/062476, filed May 23, 2017, which claims the benefit of priority under 35 U.S.C. § 119 to European Patent Application No. 16171048.8, filed May 24, 2016, the contents of which are incorporated herein by reference in their entirety.

FIELD OF THE INVENTION

This invention relates to a housing for electronic components, and in particular concerns the housing for electronic components within a vehicle.

BACKGROUND

Modern motor vehicles such as cars will generally include at least one electronic control unit (ECU), including a processor which monitors and/or controls one or more aspects of the car's performance.

A vehicle may include a central ECU which monitors and controls several of the vehicle's systems. Alternatively, or in addition, some vehicle systems may have a separate, dedicated ECU, such as an ECU for a stereo or infrared camera or for a particular passenger restraint system.

Where more than one ECU is provided in the vehicle, the ECUs will generally be in communication with one another, for example via the CAN (controller area network) bus.

A vehicle ECU may often be in position where it is liable to be exposed to liquids such as water, for instance when the vehicle drives through a deep puddle or is exposed to heavy rainfall. For this reason ECUs are generally provided in housings which aim to protect, as far as possible, the ECU and its associated electronic components from potentially damaging exposure to liquid. At the same time, the housing of an ECU should prevent the build-up of excess heat in the region of the ECU.

One example of an ECU housing which aims to fulfil these objectives is disclosed in US 2015/0208525.

It is an object of the present invention to provide an improved housing of this type.

SUMMARY

Accordingly, one aspect of the present invention provides a housing for electronic components within a vehicle, the housing includes a main compartment adapted to house one or more electronic components and a venting arrangement to allow a gas flow path between an interior of the main compartment and the exterior of the main compartment, wherein the venting arrangement includes a shield portion positioned on the exterior of the main compartment and defining a flow pathway having first and second apertures at respective first and second ends thereof, at which the flow pathway is in communication with the atmosphere; and a communication passage extending between the interior of the main compartment and the flow pathway, and joining the flow pathway at a position between the first and second ends thereof, wherein the communication passage meets the flow pathway at a point which is nearer to the first end than the second end.

Advantageously, a blocking member is provided within the flow pathway to prevent or hinder the flow of liquid from the exterior of the housing into the communication passage.

Preferably, the blocking member protrudes from an interior wall of the flow pathway at a region which is substantially aligned with the communication passage, in a direction parallel with the flow pathway in the region of the communication passage.

Conveniently, the housing has a side wall and the shield portion protrudes from the side wall and at least partly surrounds the communication passage.

Advantageously, the blocking member extends between the side wall and an interior part of the shield portion.

Preferably, the blocking member is closer to the first aperture than the communication passage.

Conveniently, at least a part of the blocking member is substantially level with the first aperture.

Advantageously, the communication passage includes an aperture formed through the side wall.

Preferably, the communication passage is substantially at right angles to the flow pathway, in the region of the communication passage.

Conveniently, apart from the communication passage, the main compartment is substantially gas tight so that no gas may flow between the main compartment and the exterior of the housing.

Advantageously, there is no direct line of sight passing from the point where the communication passage meets the flow pathway and the exterior of the housing.

Preferably, the communication passage meets the flow pathway at a point which is at least two thirds of the distance from the second aperture to the first aperture.

Conveniently, a recess is formed in a side wall of the main compartment, and the communication passage is at least partially formed by the recess.

Another aspect of the present invention provides a vehicle including a housing as described, wherein the housing is attached to a part of the vehicle so that, when the vehicle is in the normal upright position, the first aperture is higher above the ground than the second aperture.

Advantageously, when the vehicle is in the normal upright position, at least a region of the flow pathway is substantially vertical.

BRIEF DESCRIPTION OF THE DRAWINGS

In order that the present invention maybe more readily understood, embodiments thereof will now be described, by way of example, with reference to the accompanying drawings, in which.

Figure 1:
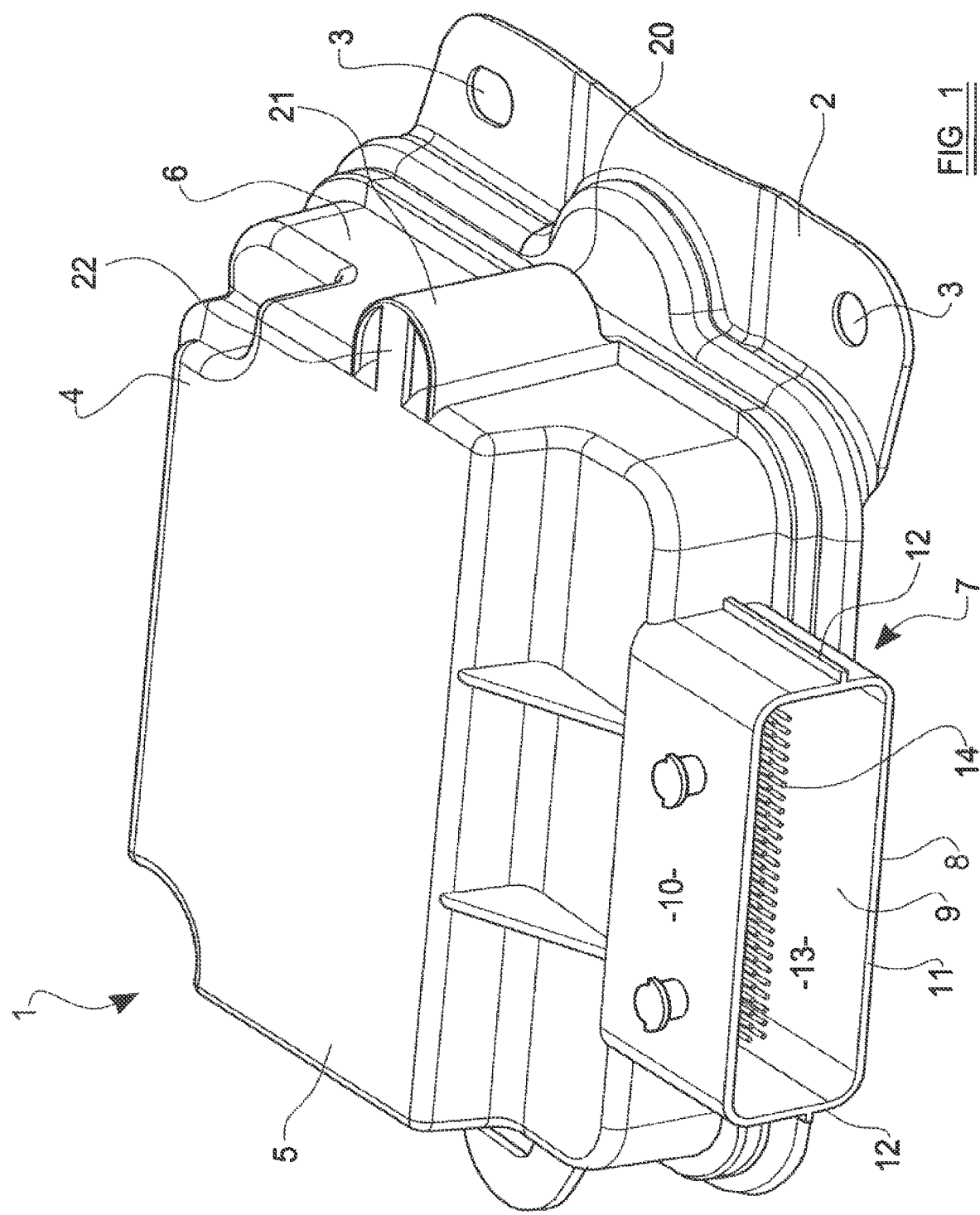
FIG. 1 shows a housing embodying the present invention.

Referring firstly to FIG. 1, a housing 1 embodying the present invention is shown.

DETAILED DESCRIPTION OF THE DRAWINGS

In this example, the housing 1 generally takes the form of a rectangular, substantially enclosed box. The housing 1 includes a baseplate 2, which is generally planar and is formed from a robust, waterproof material such as metal or plastic, which may be stamped into the desired shape. In the example shown the baseplate 2 has attachment holes 3 formed therethrough to allow the housing 1 to be attached to another component, such as the chassis of a vehicle (not shown).

The housing 1 also includes a top part 4, which includes a top wall 5 and sidewalls 6 (in this case, there are four sidewalls 6, which are joined together to extend continuously around the top part 4).

The top part 4 is placed on, and sealed to, the base plate 2, and a fluid-tight or substantially fluid-tight seal is formed between the upper surface of the baseplate 2 and the top part 4. It will be understood that together, the baseplate and top part 4 form a generally oblong container, which is sealed or substantially sealed (with the exception of a communication passage, which is described below). The baseplate 2 forms a bottom side of the oblong, and the top part 4 provides the sides and top of the oblong.

A data connection 7 is formed on the top part 4, and is preferably formed on one sidewall 6 thereof. In the embodiment shown, the data connection 7 is in the form of a hollow projection 8 having an open front 9. The projection 8 is attached to the sidewall 6 of the top part 4 at its rear side, and has top and bottom walls, 10, 11 and side walls 12 creating a cavity 13 which is accessible through the open front 9. A plurality of connection pins 14 extend from the interior of the top part 4 into the cavity 13 formed by the projection 8.

In the example shown, the connection pins 14 form an array, such as a rectangular or "D"-shaped array, and a suitable data connection (not shown) such as a connection for a CAN bus can be plugged onto the connection pins 14 to allow data communication between the interior of the housing 1 and other components.

Figure 2:
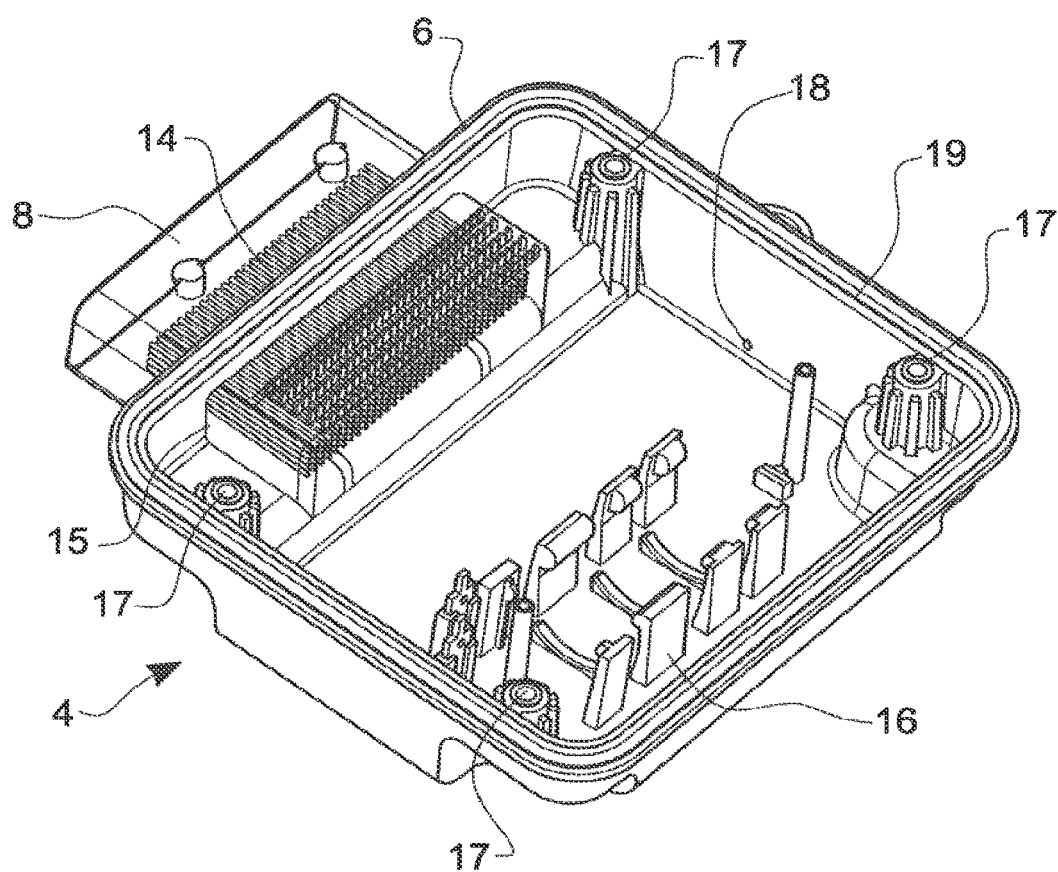
FIG. 2 shows a top part of the housing of FIG. 1.

FIG. 2 shows a view from the underside of the top part 4, with the baseplate 2 removed. It can be seen that a connection aperture 15 is formed in a sidewall 6 of the top part 4. The connection pins 14 pass through the connection aperture 15, and the connection aperture 15 is filled around the connection pins 14 with a fluid-tight material such as a resin. As will be understood by those skilled in the art, this may be achieved by holding the connection pins 14 in place, applying the resin around the connection pins 14 so that the resin fills the connection aperture 15, and then curing the resin (for instance through the application of UV light) so that the resin hardens and fixes the connection pins permanently in place, leaving the sidewall 6 fluid-tight or substantially fluid-tight.

In FIG. 2, part of the projection 8 that surrounds the connections pins 14 is shown to be translucent, for the sake of clarity.

Within the interior of the main top part 4, the ECU (not shown) may be provided, connected to the connection pins 14.

In the example shown, a cradle 16 for a capacitor is formed on the underside of the top wall 5 of the top part 4 and this capacitor provides an energy reserve for the ECU.

Four hollow cylinders are fixed to the inner side of the sidewall 6, with the hollow interior of each cylinder providing a connection bore 17. Each connection bore 17 points away from the top surface 5, i.e. directly towards the baseplate 2 when it is installed. When the baseplate 2 is put in position, screws or similar connectors may be passed through suitable apertures in the baseplates and received in the connection bores 17.

As can be seen in FIG. 2, a communication passage 18 is formed through one sidewall 6 of the top part 4. The communication passage 18 extends all of the way through the sidewall 6. In the embodiments shown, the communication passage 18 is formed near, or adjacent to, the top wall 5 of the top part 4. In preferred embodiments, the communication passage 18 is formed at least two thirds of the way from the way from the bottom edge 19 of the sidewall 6 to the location where the sidewall 6 meets the top wall 5.

The communication passage 18 is in the form of a bore or other aperture formed through the sidewall 6. The communication passage 18 is preferably round in cross-section, although any other suitable shape may be used. In preferred embodiments the diameter of the communication passage 18 is around 2 mm.

Returning to FIG. 1, a guard structure 20 is formed on the exterior of the sidewall 6 in the region of the communication passage 18.

The guard structure 20, in the embodiment shown, has two main parts.

Firstly, the guard structure 20 includes a shield portion 21, which extends from a location on one side of the communication passage 18 outwardly away from the sidewall 6, arches over the communication passage 18 and re-joins the sidewall 6 at a location on the other side of the communication passage 18.

The shield portion 21 therefore extends outwardly from the sidewall 6 over the communication passage 18.

In preferred embodiments, the shield portion 21 has a height (i.e. in a direction passing substantially parallel with the sidewall 6) which is equal to, or only slightly less than, the height of the sidewall 6 itself. In preferred embodiments the height of the shield portion 21 is at least two thirds (⅔), and preferably more than four fifths (⅘), of the height of the sidewall 6.

The shield portion 21 is open to the atmosphere at its lower end, i.e. the end that lies closest to the baseplate 2. The shield portion 21 may stop short of the baseplate 21, so there is a clear gap between the shield portion 21 and the baseplate 2 (as in the example shown in the figures), or alternatively the shield portion may extend all of the way to the baseplate 2 but have an aperture or cut-out at or near its lower end to allow air flow between the atmosphere and the lower end of the shield portion 21.

The shield portion 21 is preferably substantially continuous and unbroken.

In the example shown, the shield portion 21 is generally semi-cylindrical, although any other suitable shape may be used.

The second main component of the guard structure 20 is a bridge portion or blocking member 22. In the example shown, the blocking member 22 is substantially level with the top wall 5 of the top part 4, and extends from the sidewall 6 from a point above (preferably immediately above) the communication passage 18, substantially directly outwardly away from the sidewall 6 and joins an interior side of the shield portion 21.

The blocking member 22 is preferably generally straight and has a flat or substantially flat top surface.

In some embodiments the blocking member 22 may have sidewalls that extend downwardly (i.e. in a direction passing from the top wall 5 to the base plate 2) to lie on either side of the communication passage 18. In this case, the blocking member 22 will have an open lower side, so that the communication passage 18 is not completely surrounded by the blocking member 22.

Figure 3:
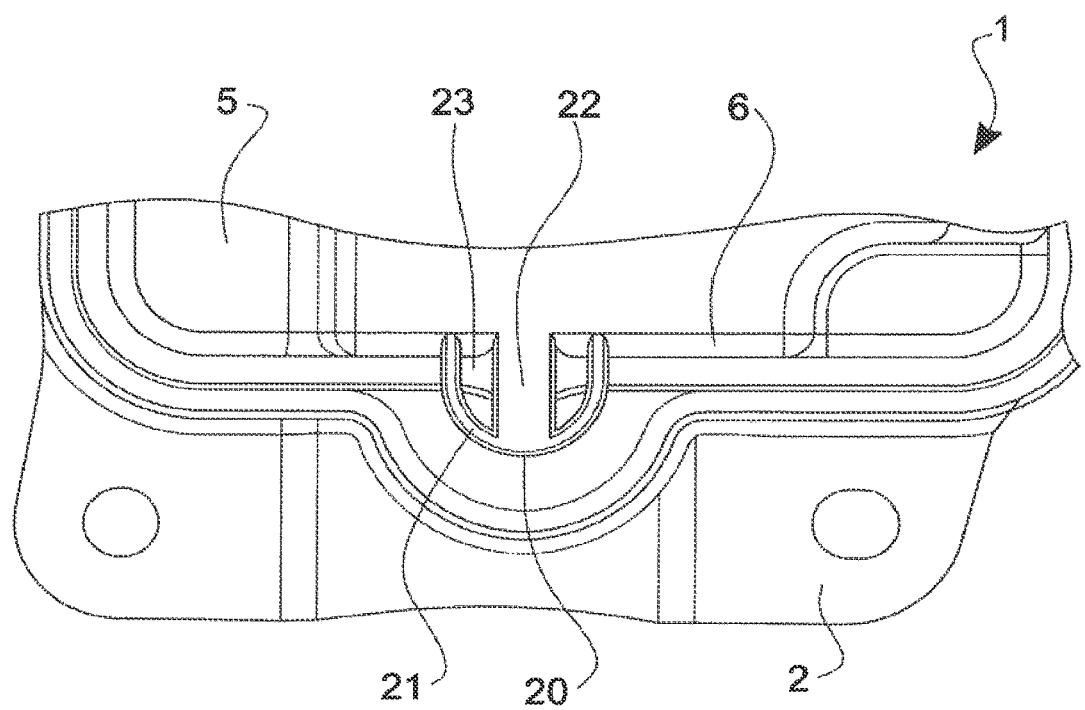
FIG. 3 shows a different view of a part of the housing of FIG. 1.

FIG. 3 shows a top-down view of a part of the housing 1. It can be seen that, from a top view of the guard structure 20, there are continuous passageways formed through the shield member 21, to the sides of the blocking member 22, which pass all of the way through the guard structure 20. If the housing 1 is viewed form directly above, it is possible to see all the way through the shield member 21 from the top to the bottom, so that the baseplate 2 is visible through these passages 23.

In preferred embodiments of the invention, there is no gas permeable and/or fluid-tight membrane provided between the exterior of the housing 1 and the interior. In some known housings of this type, a membrane is provided (which is typically gas permeable but fluid-tight or fluid-resistant) to keep fluid out of the interior of the housing, while allowing airflow between the interior of the housings and the exterior.

In embodiments of this invention it is preferred not to have a membrane of this type. Such membranes typically have very fine holes formed therethrough, which can readily become clogged with dirt or other substances, particularly if the housing is in place on a vehicle for several years. Moreover, while such membranes are gas permeable, they often significantly impede gas flow and prevent equalisation of pressure between the atmosphere and the interior of the housing, which can contribute to overheating and high humidity within the relatively small volume defined by the housing.

The guard structure 20 will be effective in preventing fluid entering the interior of the housing 1 under several commonly-encountered situations. Firstly, water may be sprayed at the housing at relatively high rates from any angle. Such a situation may be encountered when driving a vehicle through standing water on a road surface, in an off-road environment, when driving in heavy rain, or when condensation water from another vehicle component (such as a compressor) drips or falls onto the housing. These circumstances are simulated in the IPx4 test, which is conducted according to ISO20653.

As will be understood by a person skilled in this art, water jets aimed at the exterior of the housing 1 will be very unlikely to result in water entering the interior of the housing through the communication passage 18. The shield element 21 substantially surrounds the communication passage 18, and will deflect water jets which are aimed at the sidewall 6 through which the communication passage 18 is formed.

Water jets which are aimed at the communication passage 18 from above the housing 1 will be deflected by the blocking member 22, which extends above the communication passage 18 and is joined to the interior of a shield member 21.

Water jets will be very unlikely to enter the shield member 21 at its lower end, since its lower end lies close to the baseplate 2.

From all of the above it will be understood that there is no direct "line of sight" from an exterior of the housing 1 to the communication passage 18.

A person skilled in the art will therefore appreciate that if jets of water are directed at the housing 1, any such jets of water are very unlikely to result in any liquid entering the interior of the housing 1.

It is also possible that the housing may be located in standing water. This is simulated in test IPx7, which is conducted according to ISO20653.

Figure 4:
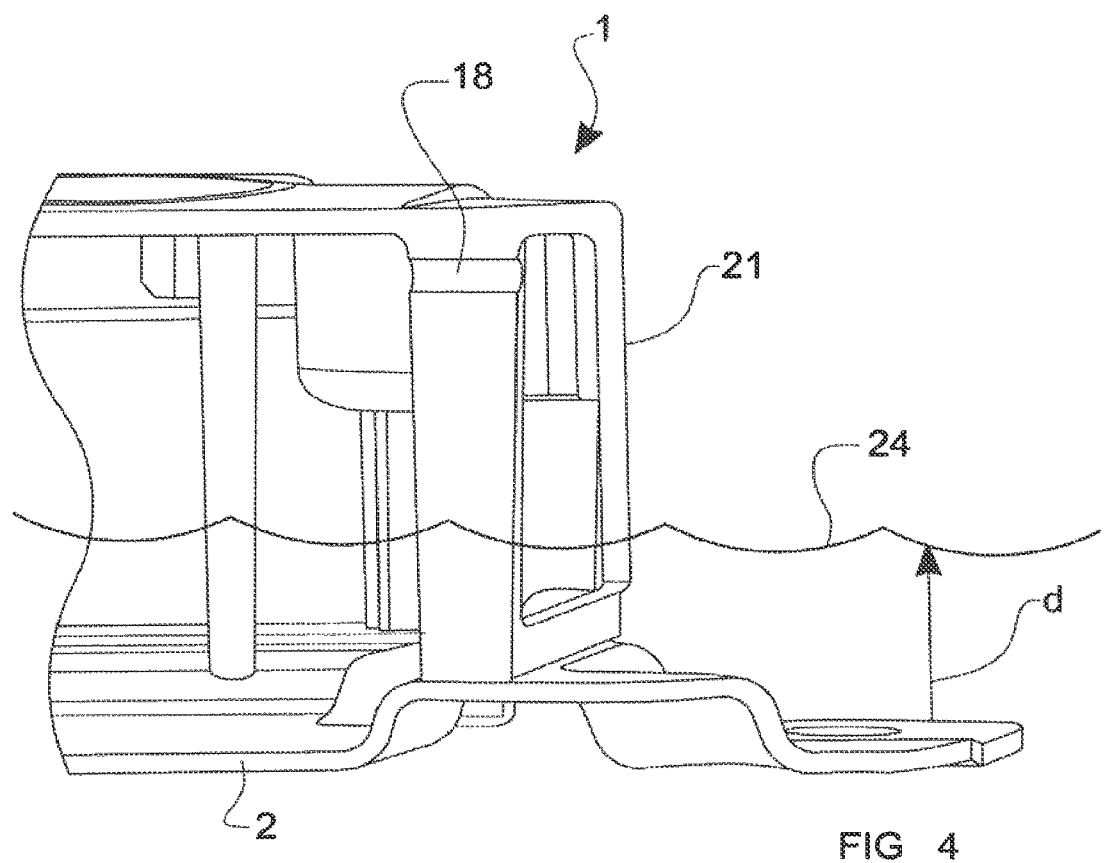
FIG. 4 shows the housing of FIG. 1 in standing water.

FIG. 4 shows a side cut-away view of the housing 1, oriented so that the baseplate 2 is lowermost. The housing 1 is standing in a quantity of water 24, which in this case is at a depth d, which may be 20 mm (although a different depth may be expected, and the skilled reader will understand how the dimensions of the components may be altered to accommodate this).

It will be understood that, because the shield member 21 is open at its lower end, water will enter the shield member 21 through its lower end. The shield member 21 is, however, also open at its upper end, and so air may still freely flow between the surrounding environment through the communication passage 18 and to the interior of the housing 1.

With regard to FIG. 4, it can be appreciated that, if the shield member 21 was not opened at its upper end, if the housing 1 stood in standing water, the water would completely block passage of air from the exterior to the communication passage 18. Circulation of air, for instance for cooling purposes, would therefore be prevented.

Moreover, the air within the interior of the housing 1 would form part of a relatively small, enclosed volume of air, blocked from communication with the atmosphere by the standing water. If there was relatively low pressure within the interior of the housing 1 (for instance if surrounding components are heated to a high temperature because of hot conditions or the operation of vehicle's engine, and the interior of the housing is at a relatively low temperature), this relatively low air pressure within the housing 1, compared to the surrounding air pressure, may cause water to be driven through the communication passage 18 by the pressure difference and into the interior of the housing 1.

However, because the shield member 21 is open at its upper end, the pressure between the interior of the housing 1 and the atmosphere may equalise, even when the housing, is standing in water which rises above the level of the lower end of the shield member 21.

Conversely, if the shield member 21 was not open at its bottom end, water could enter the shield member 21 through its upper end, and collect within the shield member 21, without any means of escape.

Arranging the shield member 21 so it is open at both its top and bottom ends ensures that communication between the atmosphere and the interior of the housing 1 can be maintained, and that any water which enters the shield member 21 may drain away when it is able to do so.

It should be understood these benefits are associated with the shield member 21 being arranged substantially vertically, i.e. aligned with gravity. In the above explanation, it is assumed that the housing 1 will be mounted so that the base plate 2 is lowermost. However, in other circumstances the housing 1 may be mounted so that the baseplate 2 is fixed to a vertical structure. In this case, it will appreciated that the shield member 21 should be rotated through 90°, so that once again it is aligned with respect to gravity, with the communication passage 18 being near the top end of the shield member 21.

In some embodiments the shield portion 21 may not be arranged quite vertically, and may be within, for example, ±45° of being vertical.

The exact form taken by the shield member 21 and the blocking member 22 are not essential to the invention. However, the shield member has opposing open ends, one which is at or near its lower end and the other of which is at or near its upper end, with the communication passage being positioned nearer to the top end than to the bottom end.

The shield member need not define a straight path, or have a regular shape along its length. It is also envisaged that the shape of the top part 4 (and/or any others of the components) may define a recess, with the shield member being formed in the recess so that the shield member does not protrude outwardly, or only protrudes outwardly by a reduced distance, beyond the overall external shape or "envelope" of the housing. In this case the walls of the recess may form some or all of the walls of the communication passage. The shield member must be external to the compartment defined by the housing, i.e. external to the enclosed space in which the ECU is provided. The shield member can, however, be integrated into the shape of the housing so that it does not, or does not significantly protrude outwardly from the housing. It will be understood that this may reduce the likelihood of the shield member being damaged, reduce the overall space occupied by the housing, and/or increase the overall aesthetic appeal of the housing.

The blocking member 22 should extend above the communication passage 18, but need not extend all of the way to the interior wall of the shield portion 21. The blocking member may take any suitable shape, and for instance an arcuate, curved and/or umbrella shape extending around the upper side of the communication aperture may be used.

It will be understood that embodiments of the invention provide a robust, simple and practical arrangement for maintaining air communication between the interior of the housing and the atmosphere, while effectively preventing the ingress of liquid into the interior of the housing.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

While the above description constitutes the preferred embodiment of the present invention, it will be appreciated that the invention is susceptible to modification, variation and change without departing from the proper scope and fair meaning of the accompanying claims.

The invention claimed is:

1. A housing for one or more electronic components adapted for use within a vehicle, the housing comprising:
    the housing forming a main compartment adapted to house the one or more electronic components, the main compartment forming a sidewall; and
    a venting arrangement to allow a gas flow path between an interior of the main compartment and an exterior of the main compartment, wherein the venting arrangement comprises;
    a guard structure including a shield portion positioned on the exterior of the main compartment and joining the sidewall of the housing, the shield portion protruding from the sidewall and at least partly surrounds a communication passage, the shield portion and the sidewall together defining a generally straight flow pathway forming an internal surface along the entire length of the flow pathway having first and second apertures at respective first and second ends thereof, the flow pathway is in communication with the atmosphere, the flow pathway is oriented substantially vertical when the housing is mounted to the vehicle, the shield portion extending from the sidewall on a first side of the communication passage away from the sidewall and arches over the communication passage and rejoins the sidewall at a second side of the communication passage, the shield portion having a height of at least two thirds of a height of the sidewall; and
    the communication passage extending generally horizontally through the sidewall and between the interior of the main compartment and the flow pathway, the communication passage joining the flow pathway at a position between the first and second ends,
    wherein the communication passage meets the flow pathway at a point which is nearer to the first end than to the second end, and
    a blocking member is provided within the flow pathway to restrict the flow of a liquid from the exterior of the housing into the communication passage, the blocking member extends substantially horizontally between the sidewall and joining an interior wall of the shield portion and positioned above the communication passage, the blocking member bisecting the flow pathway.

2. A housing according to claim 1 further comprising, the blocking member is substantially aligned with the communication passage, in a direction parallel with the flow pathway in the region of the communication passage.

3. A housing according to claim 1 further comprising, the blocking member is closer to the first aperture than to the communication passage.

4. A housing according to claim 3 further comprising, at least a part of the blocking member is substantially level with the first aperture.

5. A housing according to claim 1 wherein the communication passage comprises a communication aperture formed through the sidewall.

6. A housing according to claim 5 further comprising, the communication passage is substantially at right angles to the flow pathway, in a region of the communication passage adjacent to the communication aperture.

7. A housing according to claim 1 further comprising, apart from the communication passage, the main compartment is gas tight so that no gas may flow between the main compartment and the exterior of the housing.

8. A housing according to claim 1 further comprising, there is no direct line of sight passing from the point where the communication passage meets the flow pathway and the exterior of the housing.

9. A housing according to claim 1 further comprising, the communication passage meets the flow pathway at a point which is at least two thirds of the distance from the second aperture to the first aperture.

10. A housing according to claim 1 further comprising, a recess is formed in the sidewall of the main compartment, and the communication passage is at least partially formed by the recess.

11. A housing according to claim 1 further comprising, the housing is adapted to be attached to a part of the vehicle so that, when the vehicle is in a normal upright position, the first aperture is higher above the ground than the second aperture.

12. A housing according to claim 1 further comprising, the first aperture and the first end are positioned at or adjacent to a top part of the housing.

13. A housing according to claim 1 further comprising, the second aperture and the second end are positioned at or adjacent to a base portion of the housing.

14. A housing according to claim 1 further comprising, the shield portion is elongated and extends vertically between the first and second ends.

15. A housing according to claim 1 further comprising, the housing is adapted to be mounted such that the flow pathway is aligned with gravity such that the first end is positioned above the second end.

16. A housing according to claim 1 further comprising, the communication passage and the flow pathway form an uninterrupted flow path for air between the interior of the main compartment and the atmosphere.

* * * * *